(12) United States Patent
Ohkawa (10) Patent No.: US 11,469,574 B2
(45) Date of Patent: Oct. 11, 2022

(54) NITRIDE-BASED ELECTRONIC DEVICE HAVING AN OXIDE CLADDING LAYER AND METHOD OF PRODUCTION

(71) Applicant: KING ABDULLAH UNIVERSITY OF SCIENCE AND TECHNOLOGY, Thuwal (SA)

(72) Inventor: Kazuhiro Ohkawa, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 306 days.

(21) Appl. No.: 16/621,848

(22) PCT Filed: Jun. 14, 2018

(86) PCT No.: PCT/IB2018/054399
§ 371 (c)(1),
(2) Date: Dec. 12, 2019

(87) PCT Pub. No.: WO2019/012350
PCT Pub. Date: Jan. 17, 2019

(65) Prior Publication Data
US 2020/0119523 A1     Apr. 16, 2020

Related U.S. Application Data

(60) Provisional application No. 62/630,054, filed on Feb. 13, 2018, provisional application No. 62/532,463, filed on Jul. 14, 2017.

(51) Int. Cl.
*H01L 21/00*       (2006.01)
*H01S 5/32*        (2006.01)
(Continued)

(52) U.S. Cl.
CPC .......... *H01S 5/3213* (2013.01); *C23C 14/08* (2013.01); *C23C 14/34* (2013.01); *C23C 16/40* (2013.01);
(Continued)

(58) Field of Classification Search
CPC ..... H01L 33/0075; H01L 33/06; H01L 33/32; H01L 33/42; H01L 33/44; C23C 14/08;
(Continued)

(56) References Cited

U.S. PATENT DOCUMENTS

2004/0184497 A1 * 9/2004 Kneissl .................. H01S 5/22
372/45.01
2007/0034857 A1 2/2007 Song
(Continued)

FOREIGN PATENT DOCUMENTS

EP     1460741 A1     9/2004

OTHER PUBLICATIONS

International Search Report in corresponding/related International Application No. PCT/IB2018/054399, dated Oct. 2018.
(Continued)

*Primary Examiner* — Brook Kebede
(74) *Attorney, Agent, or Firm* — Patent Portfolio Builders PLLC (57) ABSTRACT

A nitride-based electronic device includes an oxide cladding layer, a nitride cladding layer, and a nitride active region layer arranged between the oxide cladding layer and the nitride cladding layer. First and second metal contacts are electrically coupled to the nitride active region layer. The nitride-based electronic device can be formed in a system in which a non-reactive chamber is arranged between an oxide reaction chamber and a nitride reaction chamber so that
(Continued)

oxide and nitride layers can be grown without exposing the device to the environment between growth of the oxide and nitride layers.

17 Claims, 4 Drawing Sheets (51) Int. Cl.
    *H01S 5/042*     (2006.01)
    *C23C 14/08*     (2006.01)
    *C23C 14/34*     (2006.01)
    *C23C 16/40*     (2006.01)
    *C23C 16/448*     (2006.01)
    *H01L 33/00*     (2010.01)
    *H01L 33/06*     (2010.01)
    *H01L 33/32*     (2010.01)
    *H01L 33/42*     (2010.01)
    *H01L 33/44*     (2010.01)
    *H01S 5/323*     (2006.01)

(52) U.S. Cl.
    CPC ........ *C23C 16/448* (2013.01); *H01L 33/0075* (2013.01); *H01L 33/06* (2013.01); *H01L 33/32* (2013.01); *H01L 33/42* (2013.01); *H01L 33/44* (2013.01); *H01S 5/04252* (2019.08); *H01S 5/04253* (2019.08); *H01S 5/3214* (2013.01); *H01S 5/32341* (2013.01); *H01L 2933/0016* (2013.01); *H01L 2933/0025* (2013.01); *H01S 2304/04* (2013.01)

(58) Field of Classification Search
    CPC ....... C23C 14/34; C23C 16/40; C23C 16/448; H01S 5/04253; H01S 5/0425; H01S 5/3213; H01S 5/3214
    USPC .......................................................... 438/31
    See application file for complete search history.

(56) References Cited

U.S. PATENT DOCUMENTS

2008/0286894 A1* 11/2008 Chae ..................... H01L 33/40
                                                               257/E29.144
2011/0086496 A1   4/2011  Jin
2011/0133175 A1*  6/2011  Ryu ..................... H01L 33/405
                                                                  257/43

OTHER PUBLICATIONS

Written Opinion of the International Searching Authority in corresponding/related International Application No. PCT/IB2018/054399, dated Oct. 15, 2018.

* cited by examiner

NITRIDE-BASED ELECTRONIC DEVICE HAVING AN OXIDE CLADDING LAYER AND METHOD OF PRODUCTION

CROSS-REFERENCE TO RELATED APPLICATIONS

This application is a U.S. National Stage Application of International Application No. PCT/IB2018/054399, filed on Jun. 14, 2018, which claims priority and benefit to U.S. Provisional Patent Application No. 62/532,463, filed on Jul. 14, 2017, entitled "Light Emitters Made from Nitride and Oxide Semiconductors and their Fabrication Method," and U.S. Provisional Patent Application No. 62/630,054, filed on Feb. 13, 2018, entitled "Nitride-Based Electronic Device Having an Oxide Cladding Layer and Method of Production," the disclosures of which are incorporated herein by reference in their entirety.

BACKGROUND

Technical Field

Embodiments of the subject matter disclosed herein generally relate to a nitride-based electronic device having an oxide cladding layer and method of production of such a device.

Discussion of the Background

Nitride-based electronic devices are typically produced using a metal organic chemical vapor deposition (MOCVD) system. For example, nitride-based light emitting diodes (LEDs) and lasers are typically formed by supplying p- and n-type nitride-based semiconductor gasses into a metal organic chemical vapor deposition system.

Figure 1:
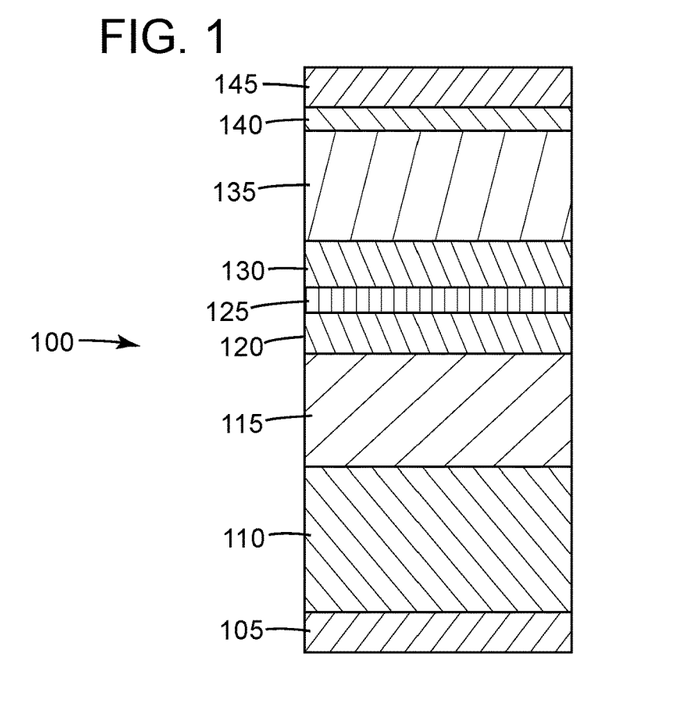
FIG. 1 is a cross-sectional schematic diagram of a nitride-based electronic device formed using metal organic chemical vapor deposition.

FIG. 1 illustrates a cross-sectional view of a laser formed using a metal organic chemical vapor deposition system. The device includes a bottom metal contact 105, on which an n-type gallium nitride (GaN) substrate 110 is formed. A n-type aluminum gallium nitride (AlGaN) cladding layer 115 is formed on the n-type gallium nitride substrate 110, and an n-type gallium nitride waveguide layer 120 is formed on the cladding layer 115. A nitride active region layer 125 comprising indium gallium nitride (InGaN) or gallium nitride is formed as multiple-quantum-wells (MQWs) on the waveguide layer 120.

The other side of the nitride active region layer 125 generally mirrors the layers below except that the layers below the nitride active region layer 125 that are n-type are p-type above the nitride active region layer 125. Specifically, a p-type gallium nitride waveguide layer 130 is formed on the nitride active region layer 125 and a p-type aluminum gallium nitride cladding layer 135 is formed on the p-type waveguide layer 130. A p-type gallium nitride contact layer 140 is formed on the cladding layer 135 and a metal contact 145 is formed on the p-type contact layer 140.

In the device of FIG. 1, the n-type 120 and p-type 130 waveguide layers direct the energy (i.e., light or laser energy) produced by the nitride active region layer 125 horizontally. These waveguide layers 120 and 130, however, do not completely prevent vertical leakage of the energy, which is why the device 100 includes relatively thick cladding layers 115 and 135.

The p-type layers 130-140 are formed using magnesium (Mg) as a dopant fed into the metal organic chemical vapor deposition system while the respective nitride gasses are fed into the system. The p-type cladding layer 135 exhibits a low refractive index, which confines light in the waveguide layers 120 and 130. Further, these p-type layers are relatively highly resistive compared to the n-type layers and also have a lot of crystal defects. The high resistivity results in high operation voltage of the electronic device, which means the electronic device also has low wall-plug efficiency. Accordingly, only a part of the operation voltage is applied to the p-type regions and the extra bias enhances degradation of the device, which reduces the device lifetime. The crystal defects in the p-type layers degrade the performance of the device and/or the lifetime of the device.

Thus, it would be desirable to provide a nitride-based electronic device with a cladding layer exhibiting at least the same low refractive index as a p-type nitrogen-based cladding layer while also exhibiting lower resistivity than a p-type nitrogen-based cladding layer.

SUMMARY

According to an embodiment, there is a nitride-based electronic device, which includes an oxide cladding layer, a nitride cladding layer, and a nitride active region layer arranged between the oxide cladding layer and the nitride cladding layer. First and second metal contacts are electrically coupled to the nitride active region layer.

According to another embodiment, there is a method of forming a nitride-based electronic device. A plurality of nitride layers are in a metal organic chemical vapor deposition system. At least a portion of an oxide layer is formed on top of the plurality of nitride layers in the metal organic chemical vapor deposition system.

According to a further embodiment, there is a method of forming an electronic device. A substrate is arranged in a metal organic chemical vapor deposition system. Nitride, metal organic, and n-type vapors are supplied to the metal organic chemical vapor deposition system to successively form a nitride cladding layer and a first nitride waveguide layer. Nitride and metal organic vapors are supplied to the metal organic chemical vapor deposition system to form a nitride active region layer on the first nitride waveguide layer. Nitride, metal organic, and p-type vapors are supplied to the metal organic chemical vapor deposition system to form a second nitride waveguide layer on the nitride active region layer. Nitride, metal organic, and p-type vapors are supplied to the metal organic chemical vapor deposition system to form a nitride contact layer on the second nitride waveguide layer. Oxide and metal organic vapors and one of p-type or n-type vapors are supplied to the metal organic chemical vapor deposition system to form an oxide cladding layer on the nitride contact layer.

According to yet another embodiment, there is a metal organic vapor deposition system, which includes a first reaction chamber comprising a first gas inlet; a second reaction chamber comprising a second gas inlet; and a non-reactive chamber interposed between, and fluidically coupled to, the first and second reaction chambers via first and second valves, respectively.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of nitride-based electronic devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 2A:
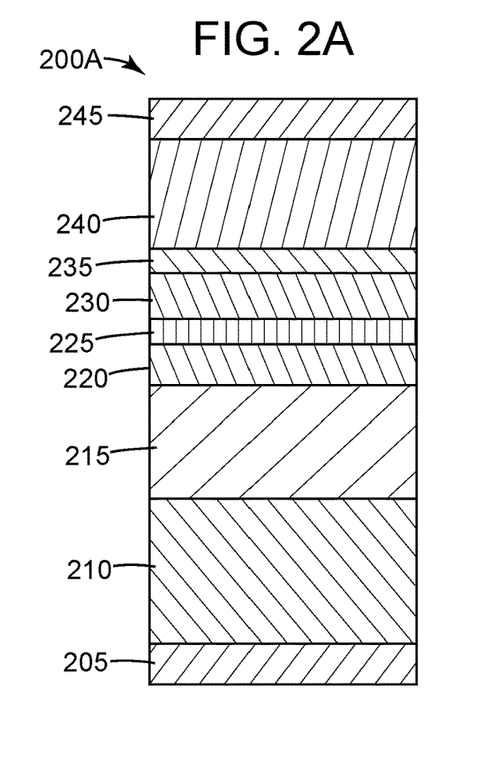
FIGS. 2A and 2B are cross-sectional schematic diagrams of nitride-based electronic devices formed using metal organic chemical vapor deposition according to an embodiment.
Figure 2B:
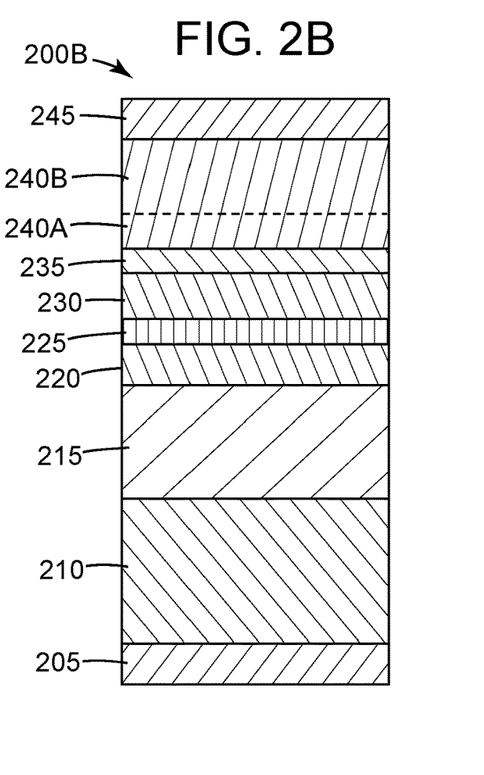

Nitride-based electronic devices 200A and 200B are illustrated in FIGS. 2A and 2B. The nitride-based electronic devices 200A or 200B include a nitride active region layer 225, an oxide cladding layer 240 (or 240A and 240B in FIG. 2B), and a nitride cladding layer 215. A first waveguide layer 220 is arranged between the nitride active region layer 225 and the nitride cladding layer 215. A second waveguide layer 230 is arranged between the nitride active region layer 225 and the oxide cladding layer 240 (or 240A and 240B in FIG. 2B). First 205 and second 245 metal contacts are electrically coupled to the nitride active region layer 225.

As illustrated in FIGS. 2A and 2B, the nitride-based electronic devices 200A and 200B also include a nitride-based contact 235 and a nitride-based substrate 210, which can be gallium nitride-based. The nitride cladding layer 215 can be an aluminum gallium nitride cladding layer, the waveguide layers 220 and 230 can be gallium nitride, indium gallium nitride, or aluminum gallium nitride waveguide layers, and the nitride active region layer 225 can be an indium gallium nitride, gallium nitride, or aluminum gallium nitride multiple-quantum-wells active region. The nitride-based substrate 210 and the nitride-based layers 215-220 below the nitride active region layer 225 are n-type and the nitride-based layers 230 and 235 above the nitride active region layer 225 are p-type.

As will be appreciated by comparing FIG. 1 with FIGS. 2A and 2B, the electronic devices 200A and 200B include an oxide cladding layer 240 (or 240A and 240B in FIG. 2B), whereas the electronic device 100 in FIG. 1 has a p-type aluminum gallium nitride cladding layer 135. The oxide cladding layer 240 (or 240A and 240B in FIG. 2B) can be comprised of n-type indium tin oxide (ITO), n-type zinc oxide (ZnO), or p-type nickel oxide (NiO). The oxide cladding layer 240 (or 240A and 240B in FIG. 2B) exhibits improved conductivity compared to the p-type nitride-based cladding layer 135 in the conventional electronic device of FIG. 1, while also providing the appropriate refractive index. This refractive index oxide cladding layer 240 (or 240A and 240B in FIG. 2B) is appropriate because the refractive indexes n of the cladding layers should satisfy the following relationship— $n_{Cladding\_Layer} < n_{Waveguide\_Layer} < n_{Active\_Region\_Layer}$. Because the refractive index of oxides, such as indium tin oxide, zinc oxide, and nickel oxide, is smaller than that of the gallium nitride waveguide layer 230, these oxides satisfy the refractive index relationship requirement while also exhibiting improved conductivity compared to an aluminum gallium nitride cladding layer used in conventional devices.

As also will be appreciated by comparing FIG. 1 with FIGS. 2A and 2B, the electronic devices 200A and 200B include the p-type gallium nitride contact 235 interposed between the p-type gallium nitride waveguide layer 230 and the oxide cladding layer 240 (or 240A and 240B in FIG. 2B), whereas the conventional device 100 in FIG. 1 includes the p-type gallium nitride contact 140 interposed between the p-type aluminum gallium nitride cladding layer 135 and the metal contact 145. This rearrangement of the location of the p-type gallium nitride contact 235 is due to the oxide cladding layer employing n-type materials, such as n-type indium tin oxide or n-type zinc oxide.

The oxide cladding layer 240 of the electronic device 200A in FIG. 2A is formed entirely within a metal organic chemical vapor deposition system, whereas for the electronic device 200B, a portion of the oxide cladding layer 240A is formed within the metal organic chemical vapor deposition system and the remaining portion of the oxide cladding layer 240B is formed outside of the metal organic chemical vapor deposition system, for example, by sputtering or using an electron beam evaporator. Forming at least a portion of the oxide cladding layer 240 within the metal organic chemical vapor deposition system avoids exposing the device structure to air and prevents any influence of dust, carbon dioxide, and/or oxides in the air. Forming a remaining portion of the oxide cladding layer 240 outside of the metal organic chemical vapor deposition system reduces the growth time to form the entire oxide cladding layer 240.

The nitride-based electronic devices 200A and 200B illustrated in FIGS. 2A and 2B can be lasers. If the nitride-based electronic devices 200A and 200B are instead light-emitting diodes, then the devices will not include the waveguide layers 220 and 230. In this case, nitride cladding layer 215 and nitride-based contact 235 will directly adjoin the nitride active region layer 225. It will be recognized that some lasers also do not employ waveguide layers, and thus a laser without waveguide layers 220 and 230 can be configured in a similar manner to a light emitting diode.

Figure 3:
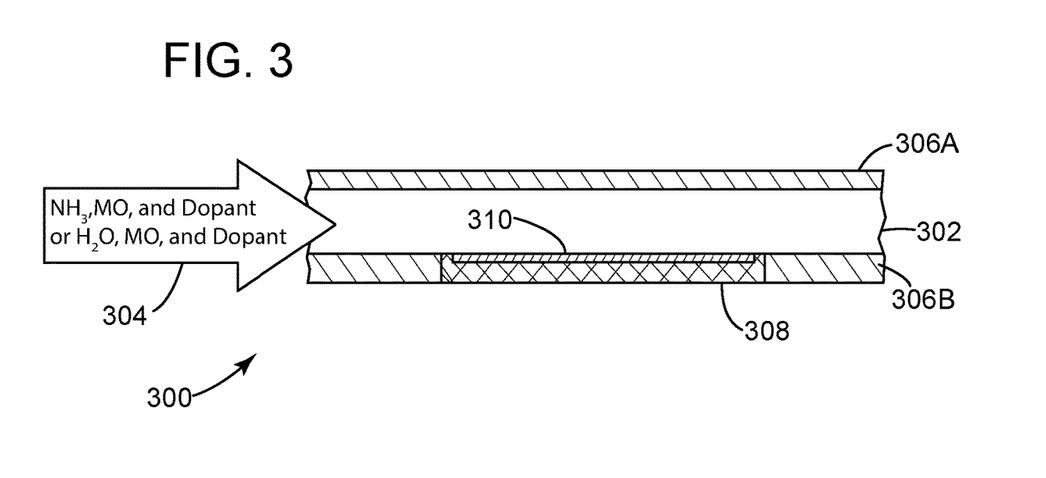
FIG. 3 is schematic diagram of a metal organic chemical vapor deposition system used for forming a nitride-based electronic device.

Methods of forming a nitride-based electronic device having an oxide cladding layer will now be described in connection with FIGS. 2A, 2B, 3, 4, and 5. FIG. 3 is schematic diagram of a metal organic chemical vapor deposition system 300 used for forming a nitride-based electronic device. The system 300 includes a reaction chamber 302 into which gasses 304 are fed. A combination of ammonia ($NH_3$), metal organic (MO), and dopant vapors are fed to form the nitride-based layers and a combination of water ($H_2O$), metal organic, and dopant vapors are fed to form the oxide cladding layer. The reaction chamber is defined by the upper 306A and lower 306B regions of a quartz tube. A heater 308 is arranged at the lower region 306B of the quartz tube and a substrate 210 on which the layers are formed is arranged on the heater 308. The heater 308, which can be a resistive or inductive heater, heats the reaction chamber 302 while the gasses 304 are being fed into the tube.

Figure 4:
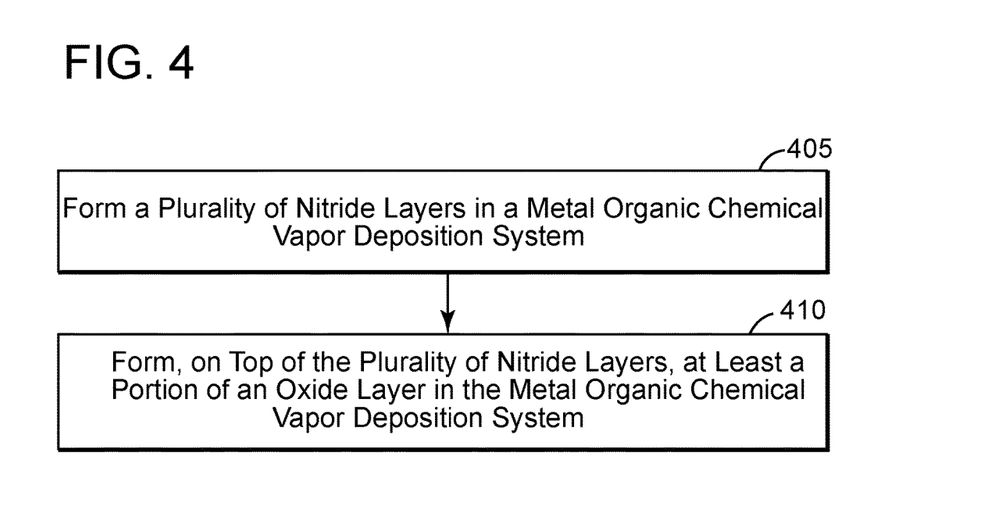
FIG. 4 is a flowchart of a method of forming a nitride-based electronic device according to an embodiment.

Turning now to FIG. 4, initially a plurality of nitride layers 215-235 are formed in the metal organic chemical vapor deposition system 300 (step 405). This can be achieved by feeding a combination of ammonia, metal organic, and dopant gases into the reaction chamber 302 while the heater 308 heats the chamber 302. The type of metal organic gasses will depend upon the layer being formed. Next, at least a portion of an oxide layer 240 (or 240A in FIG. 2B) is formed in the same metal organic chemical vapor deposition system 300 on top of the plurality of nitride layers 215-235 (step 410). In this regard, note that the nitride and oxide heterostructure may be made by the same MOCVD system without exposing the device parts to the air to prevent influence from dust, $CO_2$, and $O_2$ in the air. The combination of nitride MOCVD and oxide MOCVD is unique. The combination of metalorganic (MO) gases and $NH_3$ can grow nitrides and the combination of MO and $H_2O$ grows oxides in the same MOCVD system. This novel feature is schematically illustrated in FIG. 3. This can be achieved by feeding a combination of water, metal organic, and dopant vapors into the reaction chamber 302 while the heater 308 heats the chamber 302.

Figure 5:
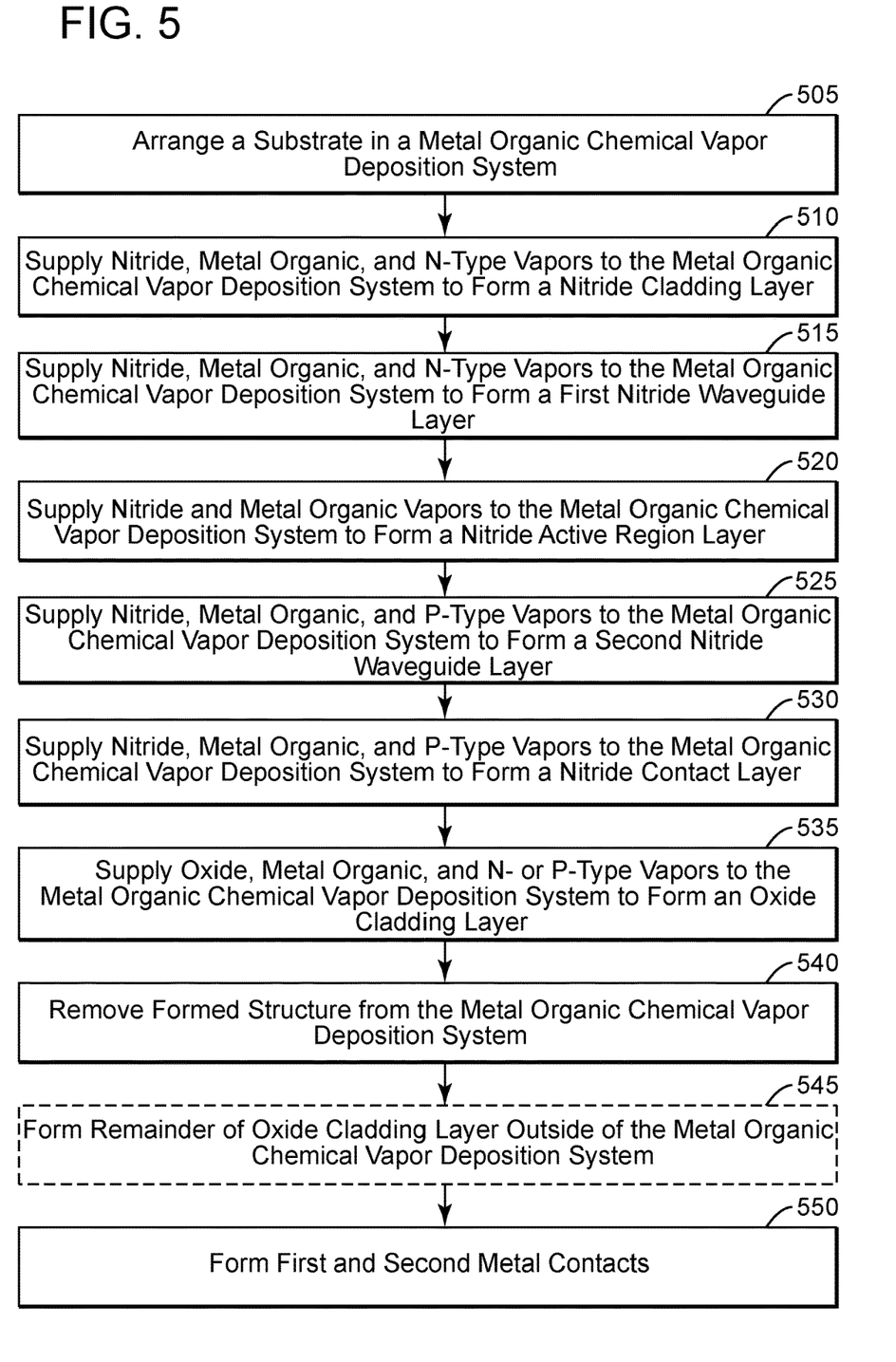
FIG. 5 is a flowchart of a method of forming a nitride-based electronic device according to an embodiment.

Turning now to the method of FIG. 5, initially, a substrate 210 is arranged in the metal organic chemical vapor deposition system (step 505). Nitride, metal organic, and n-type dopant vapors 304 are then supplied to the reaction chamber 302 to form a nitride cladding layer 215 on the nitride substrate 210 (step 510). In an embodiment, the nitride cladding layer 215 is comprised of aluminum gallium nitride, and accordingly the metal organic vapors include aluminum and gallium. Nitride, metal organic, and n-type dopant vapors 304 are then supplied to the reaction chamber 302 to form a first nitride waveguide layer 220 on the nitride cladding layer 215 (step 515). In an embodiment, the first nitride waveguide layer 220 is comprised of gallium nitride, and accordingly the metal organic vapors include gallium.

Next, nitride and metal organic vapors 304 are supplied to the reaction chamber 302 to form a nitride active region layer 225 on the first nitride waveguide layer 220 (step 520). In an embodiment, the nitride active region layer 225 is comprised of indium gallium nitride, and accordingly the metal organic vapors include indium and gallium. In another embodiment, the nitride active region layer 225 is comprised of gallium nitride, and accordingly the metal organic vapors include gallium. The nitride active region layer 225 is grown in a temperature range of 700-800° C. and the other layers are grown in a temperature range of 900-1050° C. The second nitride waveguide layer 230 is formed on the nitride active region layer 225 by supplying nitride, metal organic, and p-type dopant vapors 304 to the reaction chamber 302 (step 525). In an embodiment, the second nitride waveguide layer 230 comprises gallium nitride, and accordingly the metal organic vapor includes gallium. The nitride contact layer 235 is then formed on the second nitride waveguide layer 230 by suppling nitride, metal organic, and p-type dopant vapors to the reaction chamber 302 (step 530). In an embodiment, the nitride contact layer 235 comprises gallium nitride, and accordingly the metal organic vapor is gallium.

The oxide cladding layer 240 is then formed on the nitride contact layer 235 by supplying oxide, metal organic, and n- or p-type vapors 304 to the reaction chamber 302 (step 535). In an embodiment, the oxide cladding layer 240 comprises indium tin oxide, and accordingly the metal organic vapors include indium and tin. In another embodiment, the oxide cladding layer 240 comprises zinc oxide, and accordingly the metal organic vapors include zinc. In yet another embodiment, the oxide cladding layer 240 comprises nickel oxide, and accordingly the metal organic vapors include nickel. In the embodiment illustrated in FIG. 2A, the entire oxide cladding layer 240 is formed in the reaction chamber 302, and thus the formed structure is removed from the metal organic chemical vapor deposition system 300 (step 540) and the first 205 and second 245 metal contacts are formed (step 550). In the embodiment of FIG. 2B, only the portion 240A of the oxide cladding layer is formed in the metal organic chemical vapor deposition system 300, and accordingly the formed structure is removed from the metal organic chemical vapor deposition system 300 (step 540), the remainder 240B of the oxide cladding layer is formed outside of the metal organic chemical vapor deposition system (step 545), and then the first 205 and second 245 metal contacts are formed (step 550). In an embodiment, the remainder 240B of the oxide cladding layer can be formed by sputtering or using an electron beam evaporator. The first 205 and second 245 metal contacts can be formed by sputtering or using an electron beam evaporator.

Although embodiments have been described above as using water to form the oxide cladding layer, it will be recognized that any oxidant can be used, including oxygen ($O_2$), alcohols, and other molecules including oxygen atoms.

As noted above, the entire oxide cladding layer is formed within the metal organic vapor deposition system for the device 200A illustrated in FIG. 2A and a portion of the oxide cladding layer is formed within the metal organic vapor deposition system for the device 200B illustrated in FIG. 2B. Forming both nitride and oxide layers in a metal organic vapor deposition system is complicated and could result in exposing the device to the ambient environment, which can contain contaminants affecting subsequent layer growth. Specifically, after the nitride layers are formed, the device needs to be removed from the metal organic vapor deposition system and placed into another chemical vapor deposition system (or the same one after clearing the device of all nitride gasses and residues). This removal will expose the device to air, and thus contaminants in the air can land on the top nitride layer, which can affect the quality of the junction with the subsequently formed oxide layer and thus also affect device performance.

Figure 6:
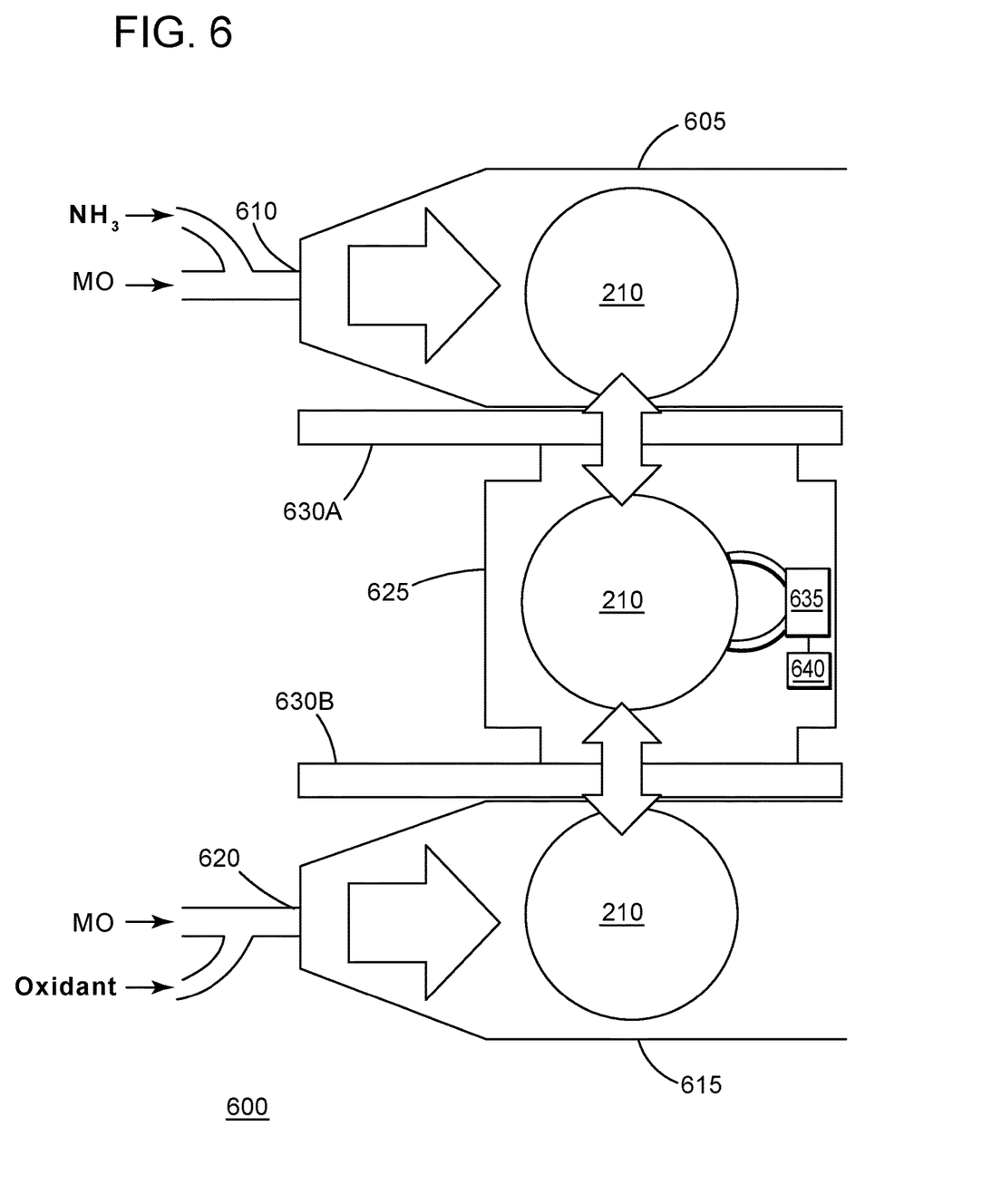
FIG. 6 is a top-view schematic diagram of a two-reactor metal organic vapor deposition system according to an embodiment.

A two-reactor metal organic vapor deposition system will now be described in connection with FIG. 6, which addresses problems arising when forming a device that requires growing both nitride and oxide layers. The metal organic vapor deposition system 600 includes a first reaction chamber 605 comprising a first gas inlet 610 and a second reaction chamber 615 comprising a second gas inlet 620. A non-reactive chamber 625 is interposed between, and fluidically coupled to, the first 605 and second 615 reaction chambers via first 630A and second 630B valves, respectively. The first 630A and second 630B valves can be, for example, gate valves.

As illustrated, the inlet 610 of the first reaction chamber 605 is configured to receive gasses, which in the illustrated embodiment are nitride ($NH_3$) and metal organic (MO) gasses, and thus this chamber can be referred to as a nitride reaction chamber. Similarly, the inlet 620 of the second reaction chamber 615 is configured to receive gasses, which in the illustrated embodiment include an oxidant and metal organic (MO) gasses, and thus this chamber can be referred to as an oxide reaction chamber. The oxidant can be, for example, water ($H_2O$), oxygen ($O_2$), alcohols, and other molecules that include oxygen atoms. Although this discussion refers to the first reaction chamber 605 as a nitride reaction chamber and the second reaction chamber 615 as an oxide reaction chamber, the first reaction chamber 605 can be an oxide reaction chamber (assuming it is fed with oxide gas) and the second reaction chamber can be a nitride reaction chamber (assuming it is fed with nitride gas).

Although not illustrated for purposes of clarity, it will be recognized that the first 605 and second 615 reaction chambers will each include a heater, as well as a mechanism for activating the heater, which can be a resistive or inductive heater.

The operation of the two-reactor metal organic vapor deposition system 600 will now be described in connection with the formation of the device 200A illustrated in FIG. 2A. The substrate 210 is initially placed in either of the first reaction chamber 605 or the non-reactive chamber 625. If the substrate 210 is initially placed in the non-reactive chamber 625, that chamber is evacuated so as to remove any contaminants while valves 630A and 630B are closed and then valve 630A is opened and the substrate 210 is moved into the first reaction chamber 605. The substrate 210 can be moved between the non-reactive chamber 625 and the first 605 and second 615 reaction chambers using a robotic arm or by human hands using a glove box. In the embodiment illustrated in FIG. 6, a robotic arm 635, under the control of a controller 640, moves the substrate 210 between the non-reactive chamber 625 and the first 605 and second 615 reaction chambers. The controller 640 can be any type of controller configured to control the operation and movement of robotic arm 635, including a microprocessor, application specific integrated circuit (ASIC), field programmable gate array (FPGA), etc. If the controller is a microprocessor, the microprocessor controls the operation and movement of robotic arm 635 using instructions loaded from a memory (not illustrated).

The nitride layers 215-235 are then formed in the first reaction chamber 605 by feeding nitride and metal organic gasses into the first reaction chamber 605 via the first inlet 610 while the substrate 210 is heated. The first reaction chamber 605 is then evacuated to remove any residual nitride gasses and then the first valve 630A is opened so that the substrate 210 carrying layers 215-235 can be moved into the non-reactive chamber 625. The first valve 630A is then closed and the second valve 630B is then opened to transfer the substrate 210 carrying layers 215-235 into the second reaction chamber 615. The second valve 630B is then closed and the oxide cladding layer 240 is then formed in the second reaction chamber 615 by feeding oxide and metal organic gasses into the second reaction chamber 605 via the second inlet 620 while the substrate 210 is heated.

Thus, the two-reactor metal organic vapor deposition system 600 allows the growth of both oxide and nitride layers for a single device without exposing the layers to contaminants in the ambient environment between the growth of different layers, and thus does not suffer from reduced device performance that can arise when the layers are exposed to air between layer growth.

It should be recognized that the two-reactor metal organic vapor deposition system 600 can be operated in a similar manner to form the device 200B illustrated in FIG. 2B. Further, although these examples involve first forming nitride layers and then forming an oxide layer, the two-reactor metal organic vapor deposition system 600 can be operated to first form one or more oxide layers and then form one or more nitride layers. Moreover, the two-reactor metal organic vapor deposition system 600 does not need to form all of the nitride or oxide layers first and then forming the other of the nitride or oxide layers. Specifically, the formation of the nitride and oxide layers can be performed repeatedly, such as, for example, forming one or more nitride layers, followed by one or more oxide layers, followed by forming one or more nitride layers, etc.

The oxide cladding layer in the disclosed nitride-based electronic devices exhibits better conductivity than conventional nitride-based electronic devices with two nitride-based cladding layers while still providing an appropriate refractive index to confine light in the waveguide layers. The better conductivity provides a more energy efficient device, which also increases the overall useful life of the device.

The disclosed embodiments provide a nitride-based electronic device and method of forming such a device. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A nitride-based electronic device, comprising:
   an oxide cladding layer;
   a nitride cladding layer;
   a nitride active region layer arranged between the oxide cladding layer and the nitride cladding layer; and
   first and second metal contacts are electrically coupled to the nitride active region layer.

2. The electronic device of claim 1, further comprising:
   a nitride contact layer arranged between the oxide cladding layer and the nitride active region layer.

3. The electronic device of claim 1, wherein the electronic device is a laser or light emitting diode.

4. The electronic device of claim 1, wherein the oxide cladding layer comprises indium tin oxide, zinc oxide, or nickel oxide.

5. The electronic device of claim 1, wherein the nitride active region layer comprises indium gallium nitride, gallium nitride, or aluminum gallium nitride.

6. The electronic device of claim 1, further comprising:
   a first waveguide layer arranged between the nitride active region layer and the nitride cladding layer; and
   a second waveguide layer arranged between the nitride active region layer and the oxide cladding layer.

7. The electronic device of claim 6, wherein a refractive index of the oxide cladding layer is smaller than a refractive index of the second waveguide layer.

8. The electronic device of claim 6, wherein the second waveguide layer is a p-type material and the oxide cladding layer is an n-type material.

9. The electronic device of claim 6, wherein the first and second waveguide layers are comprised of gallium nitride, indium gallium nitride, or aluminum gallium nitride.

10. The electronic device of claim 1, wherein the nitride cladding layer comprises aluminum gallium nitride.

11. A method of forming a nitride-based electronic device, the method comprising:
    forming a plurality of nitride layers in a metal organic chemical vapor deposition system; and
    forming, on top of the plurality of nitride layers, at least a portion of an oxide layer in the metal organic chemical vapor deposition system,
    wherein a nitride layer of the plurality of nitride layers that is adjacent to at least the portion of the oxide layer is a p-type layer and at least the portion of the oxide layer is an n-type layer.

12. The method of claim 11, wherein the plurality of nitride layers are not removed from the metal organic chemical vapor deposition until after the portion of the oxide layer is formed.

13. The method of claim 11, further comprising:
    removing a structure comprising at least the portion of the oxide layer on top of the plurality of nitride layers from the metal organic chemical vapor deposition system; and
    forming a remainder of the oxide layer outside of the metal organic chemical vapor deposition system.

14. The method of claim 13, wherein the remainder of the oxide layer is formed by sputtering or using an electron-beam evaporator.

15. The method of claim 11, wherein the entire oxide layer is formed in the metal organic chemical vapor deposition system.

16. The method of claim 11, wherein the formation of the plurality of nitride layers comprises supplying nitride, metal organic, and n-type vapors to the metal organic chemical vapor deposition system, and the formation of the portion of the oxide layer comprises supplying oxide, metal organic, and p-type vapors to the metal organic chemical vapor deposition system.

17. A method of forming a nitride-based electronic device, the method comprising:
    forming a plurality of nitride layers in a metal organic chemical vapor deposition system;
    forming, on top of the plurality of nitride layers, at least a portion of an oxide layer in the metal organic chemical vapor deposition system;
    removing a structure comprising at least the portion of the oxide layer on top of the plurality of nitride layers from the metal organic chemical vapor deposition system; and
    forming a remainder of the oxide layer outside of the metal organic chemical vapor deposition system.

* * * * *